(12) United States Patent
Drab et al.

(10) Patent No.: US 6,617,629 B1
(45) Date of Patent: Sep. 9, 2003

(54) OPTICALLY READABLE FERROELECTRIC MEMORY CELL

(75) Inventors: John J. Drab, Santa Barbara, CA (US); David A. Robinson, Redondo Beach, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/042,727

(22) Filed: Jun. 26, 2002

(51) Int. Cl.[7] .............................................. H01L 29/76
(52) U.S. Cl. ...................................... 257/295; 257/298
(58) Field of Search ................................. 257/295, 298

(56) References Cited

U.S. PATENT DOCUMENTS 5,206,829 A * 4/1993 Thakoor et al. ............ 365/117
5,621,559 A * 4/1997 Thakoor et al. ............ 359/107
5,923,182 A * 7/1999 Thakoor et al. ............ 324/765

* cited by examiner

*Primary Examiner*—David Nelms
*Assistant Examiner*—Andy Huynh
(74) *Attorney, Agent, or Firm*—John Tarlano

(57) ABSTRACT

An electrically writeable, optically readable, ferroelectric memory cell for nonvolatilely storing a single bit. The memory cell has an optically polarizeable translucent ferroelectric layer located between first and second translucent metal layers. The metal layers are used to electrically write an optical polarization state into the translucent ferroelectric layer. A translucent insulator layer, wire grid polarizer, a second translucent insulator layer and light sensing diode region are, in turn, attached to the second translucent metal layer. A polarized light beam, from a light source, is shone onto the first translucent metal layer, in order to optically read out the optical polarization state of the translucent ferroelectric layer of the memory cell. Alternately, two such memory cells can be used together in order to store a single bit.

9 Claims, 5 Drawing Sheets

OPTICALLY READABLE FERROELECTRIC MEMORY CELL

BACKGROUND OF THE INVENTION

A ferroelectric capacitor was known in the past. The ferroelectric capacitor had a ferroelectric layer that was located between two opaque metal plates. The ferroelectric capacitor was placed in an unpolarized state, or in an electrically polarized state, by creating an electric field across the opaque metal plates.

The state of polarization of the ferroelectric layer of the known ferroelectric capacitor was electrically read out. Many electrical read-outs of an electrically polarized ferroelectric layer of the ferroelectric capacitor caused degradation in the amount of electrical polarization of the ferroelectric layer of the ferroelectric capacitor. This degradation would produce an ambiguous result during a subsequent readout of the state of electrical polarization of the ferroelectric capacitor.

The present invention relates to an optically readable ferroelectric memory cell. A translucent ferroelectric layer of the optically readable ferroelectric memory cell is electrically written into either an optically polarized state or into an optically unpolarized state. The state of the ferroelectric memory cell is optically readable. The optically readable ferroelectricmemory cell is nonvolatile. The optically readable ferroelectric memory cell does not easily lose a computer bit stored therein, when exposed to nuclear radition. Many optical readouts of the optically readable ferroelectric memory cell does not degrade the optically state of a translucent ferroelectric layer of the optically readable ferroelectric memory cell.

The disclosed optically readable ferroelectric memory cell has a translucent ferroelectic layer between two translucent metal layers. The translucent ferroelectric layer can be electrically written into either an optically polarized state or into an optically unpolarized state by respectively placing a first voltage or a second voltage between the two translucent metal layers. The second voltage is equal in magnitude but opposite in direction to the first voltage.

The disclosed optically readable memory cell has a wire grid polarizer between two translucent silicon dioxide layers. One of the translucent silicon dioxide layers is adjacent to one of the translucent metal layers. The other translucent silicon dioxide layer is adjacent to a sensing diode region. The sensing diode region is built into a semiconductor substrate. A translucent silicon dioxide passivation layer covers external portions of the other layers, to protect the optically readable ferroelectric memory cell.

Many optical readouts of the optically readable ferroelectric memory cell does not degrade the optically polarization state of the translucent ferroelectric layer of the optically readable ferroelectric memory cell. A value of a binary bit stored in the optically readable ferroelectric memory cell will not be ambiguous, after many optical readouts of the disclosed optically readable ferroelectric memory cell.

The disclosed optically readable ferroelectric memory cell is electricall written from an optically unpolarized state and an optically polarized state, by creating an electric field between the translucent metal layers. The translucent ferroelectric layer of the optically readable ferroelectric memory cell is thus electrically written into an optically polarized state or optically unpolarized state, by applying a voltage between the translucent metal layers. An optically polarized state of the translucent ferroelectric layer exhibits optical birefringence to polarized light. An electro-optic coefficient of the ferroelectric material of the translucent ferroelectric layer is changed by electrically writing the translucent ferroelectric layer into an optically polarized state.

The optically polarization state of the disclosed optically readable ferroelectric memory cell is determined by shining polarized light onto the ferroelectric memory cell. The plane of polarization of the polarized light is aligned with the plane of optical polarization of the planar wire grid polarizer of the ferroelectric memory cell. More polarized light passes onto a sensing diode region of a ferroelectric memory cell that is in an optically unpolarized state, than passes onto a sensing diode region of a ferroelectric memory cell that is in an optically polarized state. The amount of current is greater through a sensing diode region of a ferroelectric memory cell that is in an optically unpolarized state, than through a sensing diode region of a ferroelectric memory cell that is in an optically polarized state.

Again, the disclosed optically readable nonvolatile ferroelectric memory cell accommodates many optical readouts of a the optical state of the translucent ferroelectric layer. Optical readout of the disclosed ferroelectric memory cell does not degrade the optical state of a translucent ferroelectric layer of the disclosed optically readable ferroelectric memory cell.

The disclosed memory cell uses a wire grid polarizer and a sensing diode region, to detect the optically polarized state or optically unpolarazed state of the disclosed ferroelectric memory cell. The optical state is read out by shining an optically polarized light beam through the top translucent metal layer of the disclosed memory cell. If the translucent ferroelectric layer is in an optically polarized state, the incident polarized light beam is split into an ordinary ray and an extraordinary ray by the translucent ferroelectric layer. The ordinary ray is retarded by the optically polarized translucent ferroelectric layer, while the extraordinary ray is not retarded. The overall effect of the retardation is to rotate the plane of the incident polarized light beam. Rotation of a plane of polarization of the incident polarized light beam is detected by the wire grid polarizer.

If the translucent ferroelectric layer is not in an optically polarized state, the polarized light is not split. The sensing diode region detects the amount of polarized light that passes through the wire grid polarizer. More light passes through the wire grid polarizer, if the polarized light is not split than if the polarized light is split. In this manner the optical state of the optically readable nonvolatile ferroelectric memory cell is optically read out.

Again, to optically read out the optical state of the translucent ferroelectric layer, an optically polarized light beam is shined onto the disclosed optically readable nonvolatile ferroelectic memory cell. The plane of polarization of the incident polarized light beam is rotated, if the translucent ferroelectric layer is in an optically polarized state. If the translucent ferroelecric layer is in an optically polarized state, the translucent ferroelectric layer splits the incident optically polarized light beam into an ordinary light ray and an extraordinary light ray. If the translucent ferroelectric layer is in an optically polarized state, the ordinary light ray is slowed down, that is, retarded. The extraordinary light ray is not retarded. After the two rays have passed through the translucent ferroelectric layer, they form an optically polarized light beam whose plane of optical polarization has been rotated. The plane of polarization of the incident polarized light beam is not rotated, if the translucent ferroelectric layer is not in an optically polarized state.

The rotation or non-rotation of the optically polarized light beam is detected by means of the wire grid polarizer and the optical-beam-intensity sensing diode region. The plane of polarization of the incident polarized light beam and plane of polarization of the wire grid polarizer are initially aligned to be coplanar. Then, more polarized light will pass through the optically readable ferroelectric memory cell when the translucent ferroelectric layer is not in an optically polarized state, than will pass through the optically readable ferroelectric memory cell when the translucent ferroelectric layer is in an optically polarized state. The sensing diode determines whether more or less light passes through the optically readable ferroelectric memory cell, to sense whether the disclosed memory cell is not in an optically polarized state or is in an optically polarized state. The condition of the optically readable ferroelectric memory cell, wherein the translucent ferroelectric layer is in an optically polarized state, can signify a binary one bit. The condition of the optically readable ferroelectric memory cell, wherein the translucent ferroelectric layer is in an optically unpolarized state, can signify a binary zero bit.

A plurality of disclosed optically readable ferroelectric memory cells is used as a memory array of a computer. Each optically readable ferroelectric memory cell stores a single binary digit, that is a bit.

Two optically readable ferroelectric memory cells are used in a differential configuration, to form a single bit storage unit. One ferroelectric memory cell is electrically written into an optically polarized state and the other ferroelectric memory cell is electrically written into an optically unpolarized state, to store a single bit. The two ferroelectric memory cells are, simultaneously, optically read out, to determine the binary value of a single bit.

SUMMARY OF THE INVENTION

An optically readable ferroelectric memory cell comprising a first translucent conductive layer, a side of a translucent ferroelectric layer, that is electrically writable into either an optically polarized state or optically unpolarized state, in parallel contact with the first translucent conductive layer, a second translucent conductive layer in parallel contact with a second side of the translucent ferroelectric layer, a first translucent insulator layer in parallel contact with a second side of the second translucent conductive layer, a side of a planar polarizer in parallel contact with a second side of the first translucent insulator layer, a second translucent insulator layer in parallel contact with a second side of the planar polarizer, and a sensing diode region within a surface of a semiconductor substrate, the sensing diode region in parallel contact with a second side of the second translucent insulator layer.

DESCRIPTION OF THE PREFERRED EMBODIMENT

Figure 1:
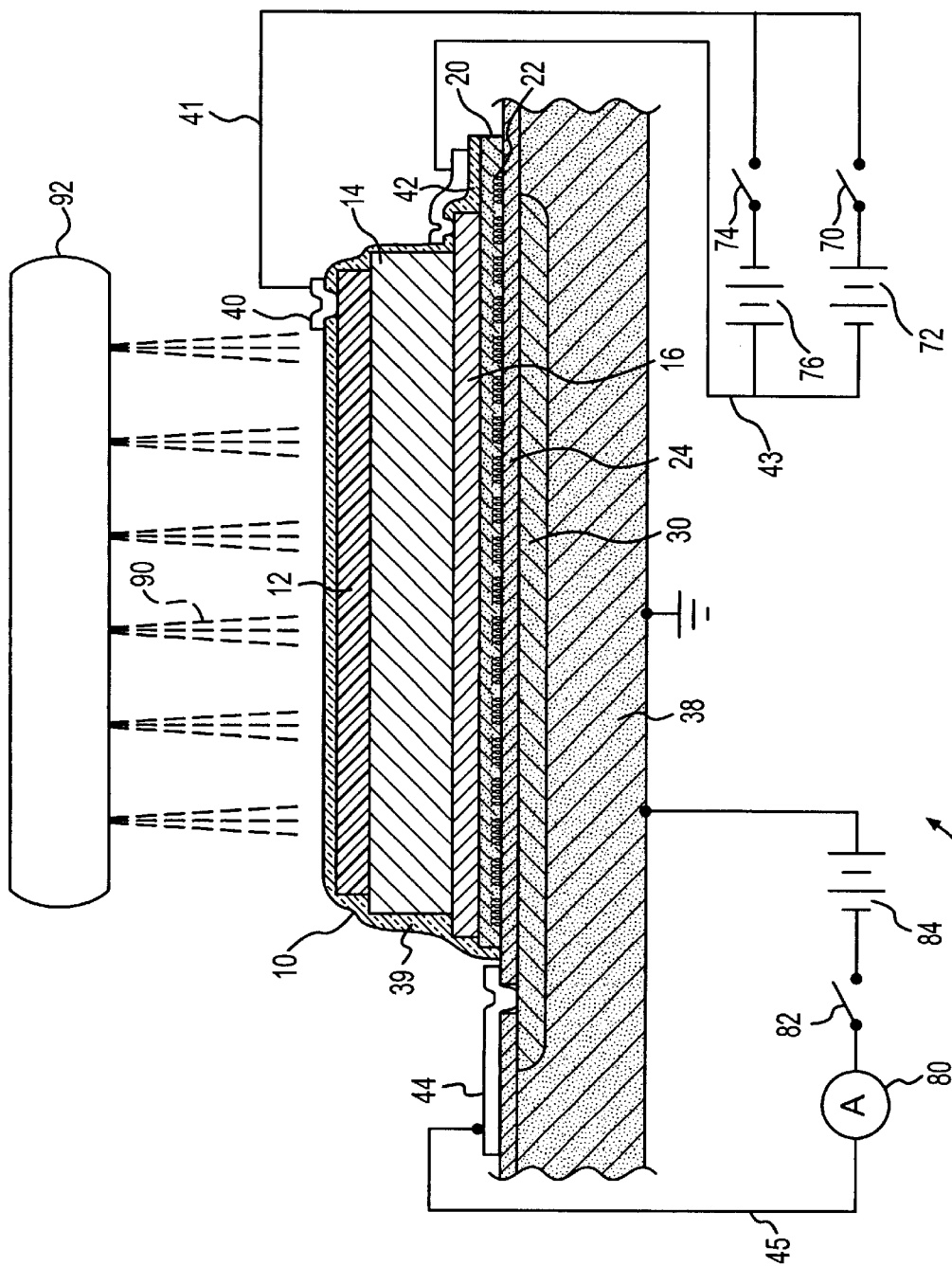
FIG. 1 is a sectional view of an optically readable ferroelectric memory cell, plus a schematic diagram of electrical circuitry and a plan view of a polarized light source optical arrangement, both for use with the optically readable ferroelectric memory cell.

FIG. 1 shows an optically readable ferroelectric memory cell 10. The optically readable ferroelectric memory cell 10 has a top translucent metal layer. The top translucent metal layer 12 is located on a translucent ferroelectric layer 14. Translucent ferroelectric layer can be electrically written into an optically polarized state or optically unpolarized state. The state of the translucent ferroelectric layer is optically readable. The translucent metal layer 12 is a thin vapor deposited gold film. The translucent ferroelectric layer 14 is a translucent PZLT ferroelectric layer. Alternatively, the translucent ferroelectric layer 14 can be made from a ferroelectric material such as Y1, PZ1, $SrBi_2Ta_2O_9$, $SrBi_2Nb_2O_9$, or BST.

The translucent ferroelectric layer 14 is located on a bottom translucent metal layer 16. The bottom translucent metal layer 16 is a thin vapor deposited translucent gold film. The bottom translucent metal layer 16 is located on a first translucent silicon dioxide layer 20. The first translucent silicon dioxide layer 20 is located on a planar wire grid polarizer 22. Portions of the silicon dioxide layer 20 are located between wires of the wire grid polarizer 22. The planar wire grid polarizer 22 is imbedded into the first translucent silicon dioxide layer 20. The planar wire grid polarizer 22 is located on a second translucent silicon dioxide layer 24. The second translucent silicon dioxide layer 24 is located on a sensing diode region 30 and covers sensing diode region 30. The sensing diode region 30 was formed into a silicon substrate 38. The sensing diode region 30 is an n-type material and the silicon substrate 38 is a p-type material.

Again, the bottom translucent metal layer 16 is located on the first translucent silicon dioxide layer 20. The first silicon dioxide layer 20 is located on the planar wire grid polarizer 22. Imbedded in the first translucent silicon dioxide layer 20 is the planar wire grid polarizer 22. The planar wire grid polarizer 22 rides on the second translucent silicon dioxide layer 24. Below the second translucent silicon dioxide layer 24 is the sensing diode region 30. The sensing diode region 30 is located in the silicon substrate 38.

A translucent passivation glass layer 39 covers exterior portions of the memory cell 10. A first metal electrode 40 is connected to the first translucent metal layer 12 through a hole made in the translucent passivation glass layer 39. A second metal electrode 42 is connected to the second translucent metal layer 16 through another hole made in the translucent passivation glass layer 39. A third metal electrode 44 is connected to the sensing diode region 30 through a hole made in the second silicon dioxide layer 24. The translucent passivation glass layer 39 is a cover for the optically readable ferroelectric memory cell 10 of FIG. 1.

A lead wire 41 is connected to the first metal electrode 40. A lead wire 43 is connected to the second metal electrode 42. A lead wire 45 is connected to the third metal electrode 44.

The optically readable ferroelectric memory cell 10 of FIG. 1 is placed in a memory cell circuit 68, as shown in FIG. 1. A switch 70 is connected to lead wire 41. A positive electrode of a battery 72 is connected to switch 70. A negative electrode of battery 72 connected to lead wire 43. A switch 74 is also connected to lead wire 41. A negative electrode of a battery 76 is connected to switch 74. A positive electrode of battery 76 is connected to lead wire 43.

Further, an ammeter 80 is connected to lead wire 45. A switch 82 is connected to ammeter 80. A negative electrode of a battery 84 is connected to switch 82. A positive electrode of battery 84 is connected to silicon wafer 38. Silicon Wafer 38 is grounded.

In FIG. 1, the plane of polarization of an optically polarized light beam 90 coming from an optically polarized light source 92 is aligned with the plane of polarization of the planar wire grid polarizer 22. Polarized light source 92 is shown as continuously energized in FIG. 1, although it can be energized intermittently during readout of ferroelectric memory cell 10.

In FIG. 1, translucent ferroelectric layer 14 is initially in an optically unpolarized state. In order to optically read that the translucent ferroelectric layer 14 is in an optically unpolarized state, the polarized light 90 from the polarized light source 92 is shined upon the top translucent metal layer 12 and the switch 82 is simultaneously closed. Since translucent ferroelectric layer 14 is not in an optically polarized state, a large current passes into the ammeter 80 from ground, due to a large percentage of the polarized light 90 passing through polarizer 22 and onto sensing diode region 30. The plane of polarization of polarized light 90 is unaffected by the translucent ferroelectric layer 14. A large current that passes through ammeter 80 is indicates the translucent ferroelectric layer 14 is in an unpolarized state. Switch 82 is opened. In this manner the optically unpolarized state of translucent ferroelectric laver 14 is optically read out.

By closing switch 70 for a time and then opening switch 70, the translucent ferroelectric layer 14 is electrically written into an optically polarized state. A first voltage is thus placed between translucent metal layers 12 and 16 Translucent ferroelectric layer 14 is thus electrically written into an optically polarized state. A small current passes through the ammeter 80 when switch 82 is closed, due to a small percentage of polarized light 90 passing through the planar wire grid polarizer 22, and onto sensing diode region 30, since ferroelectric layer 14 is in an optically polarized state. The plane of polarization of polarized light 90 is rotated by the translucent ferroelectric layer 14. A small current passing through ammeter 80 indicates that ferroelectric layer 14 is in an optically polarized state. Thus the optically polarized state of translucent ferroelectric layer 14 is optically read out.

A large current passing through ammeter 80 could indicate that a zero bit was in translucent ferroelectric layer 14. A small current passing through ammeter 80 could indicate that a one bit was in translucent ferroelectric layer 14.

By closing switch 70, a more positive voltage is placed on first translucent metal layer 12 than the voltage placed on the second translucent metal layer 16, to electrically write translucent ferroelectric layer 14 into an optically polarized state. The voltage difference causes positive iron ions and negative oxygen ions to separate. This voltage difference causes optical birefringence to occur in the translucent ferroelectric layer 14. The birefringence is detected by sending polarized light through translucent ferroelectric layer 14. By use of the voltage difference, translucent ferroelectric layer 14 electrically written into an optically polarized state.

A translucent ferroelectric layer 14 that is in an optically polarized state splits the incident polarized light beam 90 into an ordinary ray and an extraordinary ray. The speed of the ordinary ray is slowed compared to the speed of the extraordinary ray. The plane of polarization of polarized light beam 90 that passes through an optically polarized ferroelectric layer 14, is rotated. The light beam 90, whose plane of polarization has been rotated, is passed onto the planar wire grid polarizer 22. The percentage of light beam 90 that passes through the planar wire grid polarizer 22, is low. This result occurs because the plane of polarization of the rotated light beam 90 is not aligned with respect to the plane of polarization of the planar wire grid polarizer 22.

The polarized light beam 90 is incident on the first top translucent metal layer 12. The plane of polarization of light beam 90 coming out of polarized light source 92 is parallel to the polarization plan of planar wire grid polarizer 22. Since the translucent ferroelectric layer 14 is in an optically polarized state, the percentage of light beam 90 that passes through the planar wire grid polarizer 22 is a low percentage of the amount of light in the incident polarized light beam 90.

Since ferroelectric layer 14 has been electrically written into an optically polarized state by closing switch 70, a small current passes through sensing diode region 30, when switch 82 is closed. The sensing diode region 30 senses a low intensity of light. When switch 82 is closed, the battery 84 transmits a small number of electrons through ammeter 80, sensing diode region 30 and substrate 38. This result is due to small percentage of light, from light beam 90, passing onto sensing diode 30 region, since ferroelectric layer 14 is in an optically polarized state. A small positive current passes through sensing diode region 30 from substrate 38. The small positive current is sensed by ammeter 80, to read out that the translucent ferroelectric layer 14 is in an optically polarized state. In this manner the optically polarized state of translucent ferroelectric laver 14 is optically read out.

Switch 74 is closed to place a more positive voltage on the second translucent metal layer 16 than is a voltage placed on the first translucent metal layer 12. Translucent ferroelectric layer 14 is electrically written into an optically unpolarized state. The voltage difference causes positive iron ions and negative oxygen ions to come together. This voltage difference eleminates birefrigence to polarized light, in the translucent ferroelectric layer 14. Again, the translucent ferroelectric layer 14 is now electrically written into an optically unpolarized state.

The planar wire grid polarizer 22 and a sensing diode region 30 are used to determine whether or not the plane of polarization of incident polarized light beam 90 is rotated by the translucent ferroelectric layer 14. The amount of polarized light passing through the planar wire grid polarizer 22 is detected by the sensing diode region 30.

The polarized light beam 90 is incident on the first top translucent metal layer 12. The plane of polarization of light beam 90 coming out of polarized light source 92 is parallel to the polarization plan of planar wire grid polarizer 22. Since the translucent ferrolectric layer 14 is in an optically unpolarized state, the percentage of light beam 90 that passes through wire grid polarizer 22 is a high percentage of the amount of light in incident polarized light beam 90.

Since ferroelectric layer 14 has been electrically written into an optically unpolarized state by closing switch 74, a large current passes through sensing diode region 30, when switch 82 is closed. The sensing diode region 30 senses a high intensity of light. When switch 82 is closed, the battery 84 transmits a large number of electrons through ammeter 80, sensing diode region 30 and substrate 38. This result is due to high percentage of light, from light beam 90, passing onto sensing diode 30 region, since ferroelectric layer 14 is in an optically unpolarized state. A large positive current passes through sensing diode region 30 from substrate 38. The large positive current through ammeter 80 indicates that the translucent ferroelectric layer 14 is in an optically unpolarized state. Thus the optically unpolarized state of translucent ferroelectric layer is optically read out.

Less positive current will pass through sensing diode region 30 from substrate 38 when the ferroelectric layer 14 is in an optically polarized state, than when ferroelectric layer 14 is in an optically unpolarized state.

Figure 2:
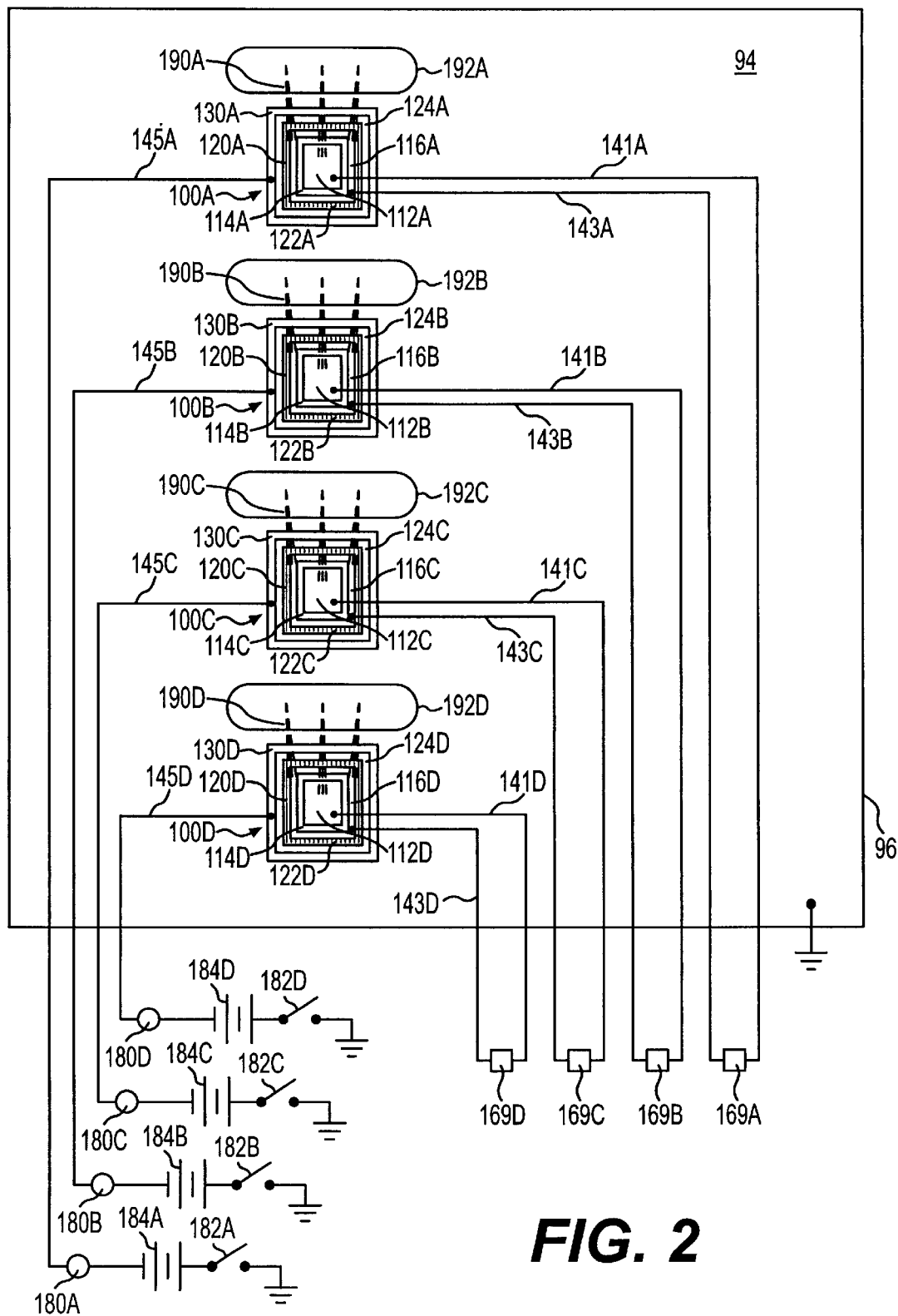
FIG. 2 is a plan view of a memory array of four optically readable ferroelectric memory cells, plus a schematic diagram of electrical circuitry and a plan view of a polarized light source, both for use with the optically readable ferroelectric memory cells.

FIG. 2 shows a memory array 94 of four optically readable ferroelectric memory cells 100A, 100B, 100C and 100D. Array 94 can store four binary bits of information. Each of the four ferroelectric memory cells 100A to 100D is equivalent, structurally and in operation, to the structure of the optically readable ferroelectric memory cell 10 of FIG. 1. The four ferroelectric memory cells 100A to 100D of memory array 94 are built into a p-type silicon substrate 96. Silicon substrate 96 is grounded.

Each of the four optically readable ferroelectric memory cells 100A to 100D of FIG. 2 functions in a manner that is equivalent to the function of the optically readable memory cell 10 of FIG. 1, described above. Four binary bits can be nonvolatilely stored in memory array 94 and optically read out of memory array 94. The information stored in array 94 will not be corrupted even after a large number of optical readouts.

FIG. 2 shows a lead wire 141A that is connected to translucent metal layer 112A of optically readable ferroelectric memory cell 100A. A lead wire 143A is connected to translucent metal layer 112A of optically readable memory cell 100A, through an opening in a glass passivation layer (not shown). Lead wires 141B, 141C and 141D are similarly attached to transparent metal layers 112B, 112C and 112D respectively. Lead wires 143B, 143C and 143D are similarly attached to translucent metal layers 116B, 116C and 116D, respectively.

Figure 3:
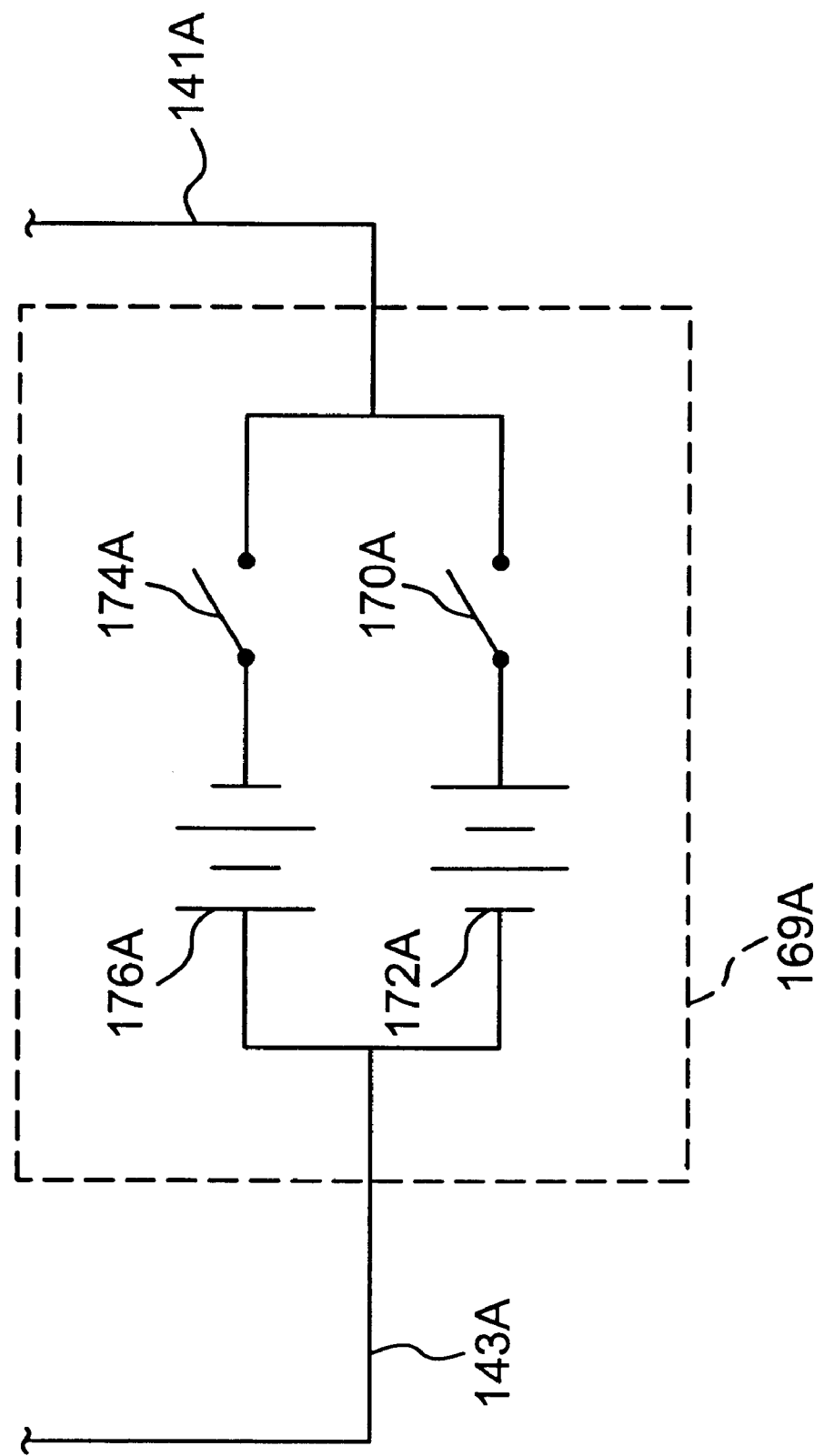
FIG. 3 is a schematic diagram of a voltage source to polarize or unpolarize an optically readable ferroelectric memory cell of FIG. 2.

A polarizing/depolaring voltage source 169A is connected between lead wires 141A and 143A, to electrically write translucent ferroelectric layer 114A into either an optically polarized state or in an optically unpolarized state. The polarizing/depolarizing voltage source 169A for optically readable memory cell 100A is shown in greater detail in FIG. 3. Switch 170A and voltage source 172A of FIG. 3 operate equivalently to switch 70 and voltage source 72 of FIG. 1. Switch 174A and voltage source 176A operate equivalently to switch 74 and voltage source 76 of FIG. 1.

An ammeter 180A is connected to lead wire 145A. A voltage source 184A and switch 182A are connected to an ammeter 180A. Switch 182A is grounded. Lead wires 145A is connected to sensing diode region 130A. Lead wires 145B, 145C and 145D are similarly connected to sensing diode regions 130B, 130C and 130D, respectively. Ammeters 180B, 180C and 180D, voltage sources 184B, 184C and 184D and switches 182B, 182C and 182D are respectively attached to lead wires 145B, 145C and 145D. Switches 182B, 182C and 182D are grounded.

The polarizing/depolarizing voltage sources 169B, 169C and 169D, of FIG. 2, are attached to optically readable ferroelectric memory cells 100B, 100C and 100D respectively. Voltage sources 169B, 169C and 169D are attached by means of lead wires 141B and 143B, 141C and 143C, and 141D and 143D, respectively, to optically readable memory cells 100B, 100C and 100D. The polarization/depolarization voltage sources 169B, 169C and 169D are constructed in an equivalent arrangement to voltage source 169A of FIG. 3.

Each of optically readable memory cells 100A to 100D of memory array 94 of FIG. 2 is individually electricall written into an optically polarized state or optically unpolarized state, by using polarizing/depolarizing voltage sources 169A to 169D, respectively.

In FIG. 2, polarized light sources 192A to 192D shine polarized light beams into translucent metal layers 112A to 112D, to optically read out information stored in memory cells 100A to 100D. Polarized light beams 190A to 190D are individually shone on ferroelectric layers 114A to 114D, respectively. A plane of polarization of each of incident polarized light beams 190A to 190D, is aligned with a plane of polarization of each of the wire grid polarizers 122A to 122D of memory cells 100A to 100D, respectively. In order to detect which of ferroelectric layers 114A to 114D of memory cells 100A to 100D is in a polarized state or is in an unpolarized state, the polarized light beams 190A to 190D, respectively from polarized light source 192A to 192D, are respectively shone, individually, upon the translucent metal layer 112A to 112D, at separate times or at the same time. Switches 182A to 184D are closed, for a time, while polarized light beams 190A to 190D are individually shining on an associated translucent metal layer 112A to 112D. A single polarized light source could be energized, so that all four memory cells are illuminated at the same time, rather than using a multiple number of light sources 192A to 192D to individually illuminate translucent metal layers 112A to 112D.

A lesser amount of polarized light passes onto sensing diode regions 130A to 130D that are below ferroelectric layers 114A to 114D that are in optically polarized states, than ferroelectric layers 114A to 114D that are in optically unpolarized states. The sensing diode regions 130A to 130D sense the intensity of polarized light. The batteries 184A to 184D transmit less current through ammeters 180A to 180D, from sensing diode regions 130A to 130D, that sense a low intensity of polarized light, when switches 182A to 182D are closed. The amount current through each of sensing diode regions 130A to 130D, and ammeters 180A to 180D, allows optical read out which translucent ferroelectric layers 114A to 114D of memory cells 100A to 100D are in optically polarized states and which translucent ferroelectric layers 114A to 114D are in optically unpolarized states. Less current passes through sensing diode regions 130A to 130D of associated memory cells 100A to 100D that are in polarization states than associated memory cells 100A to 100D, that are in unpolarization states.

Figure 4A:
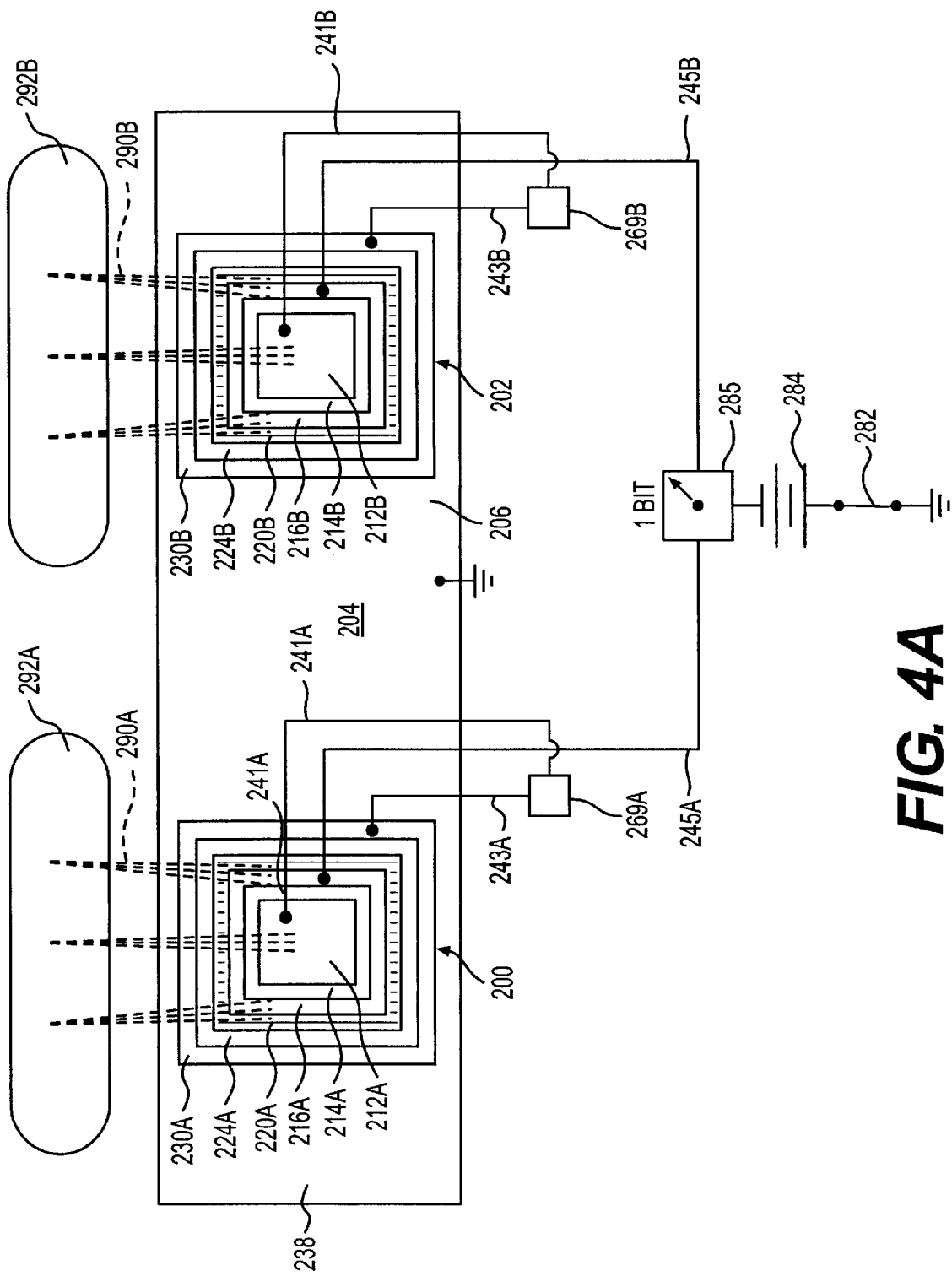
FIG. 4A is a plan view of a bit storage unit having two optically readable ferroelectric memory cells, the optically readable ferroelectric memory cells being placed in a differential configuration of optical polarization/unpolarization to signify a zero bit, plus a schematic diagram of electrical circuitry and a plan view of an optically polarized light source, both for use with the optically readable ferroelectric memory cells.
Figure 4B:
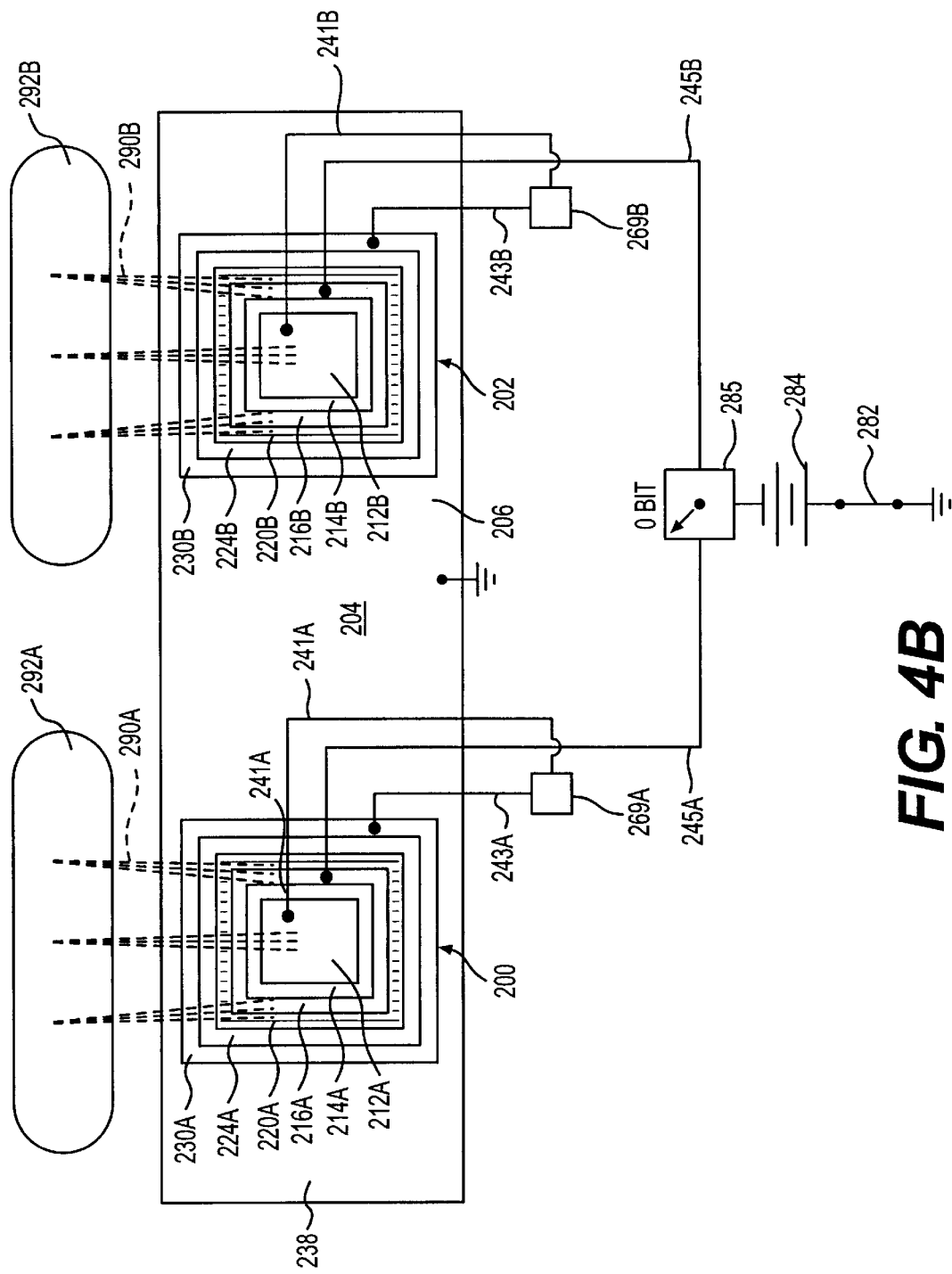
FIG. 4B is a plan view of a bit storage unit having two optically readable ferroelectric memory cells, the optically readable ferroelectric memory cells being placed in differential configuration of optical unpolarization/polarization to signify a one bit, plus a schematic diagram of electrical circuitry and a plan view of an optically polarized light source, both for use with the optically readable ferroelectric memory cells.

FIGS. 4A and 4B show two optically readable nonvolatile ferroelectric memory cells 200 and 202 of bit storage unit 204. Cells 200 and 202 have the same structure as cell 10 of FIG. 1. The bit storage unit 204 stores a single binary bit. The two optically readable nonvolatile memory cells 200 and 202 are operable in a differential configuration to nonvolatilely store a single binary bit in bit storage unit 204. that is, only one of the two memory cells is placed in an optically polarized state, in the differential configuration. Circuitry to electrically write one memory cell into an optically polarized ste and to electrically write the othe memory cell into an optically unpolarized state, is shown. The circuitry uses polarizing/depolarizing voltage sources 269A and 269B. Polarization/depolarization voltage sources 269A and 269B are equivalent to voltage source 169A, shown in FIG. 3. Voltage source 269A is connected across translucent metal layers 212B and 216A. Voltage source 269B in connected across translucent memory layers 212A and 216B. Voltage sources 269A and 269B are connected between leads 241A and 243A and between 241B and 243B, respectively. Other circuitry to aid in optically reading which of the two memory cells is electrically written into an optically polarized state, and thus causes one sensing diode region to conducts less current than the other, is also shown. This latter circuitry includes a differential current detector 285 connected to sensing diode regions 230A and 230B via leads 245A and 245B, respectively. A voltage source 284 is connected to differential current detector 285. A switch 282 is connected between voltage source 284 and ground potential.

In FIGS. 4A and 4B switch 282 is closed. In FIG. 4A , differential current detector 285 shows that a one bit is stores in unit 204. In FIG. 4B differential current detector 284 shows that a zero bit is stored in unit 204.

Again, each of optically readable memory cells 200 and 202 is structurally equivalent to the structure of optically readable memory cell 10 of FIG. 1. The memory cells 200 and 202 are built into a silicon substrate 206.

Translucent layers 212A, 212B, 216A and 216B are shown. Ferroelectric layers 214A and 214B are shown. Leads 241A and 241B are connected to translucent layers 212A and 212B respectively. Leads 243A and 243B are connected to translucent layers 216A and 216B respectively.

Again, the two optically readable memory cells 200 and 202 of FIGS. 4A and 4B are used together as a single bit storage unit 204, to store a single bit. The two cells 200 and 202 are written into a differential configuration of polarization/unpolarization or polarization/polarization by voltage sources 269A and 269B, to nonvolatilely store a single binary bit of information. That is, one optically readable memory cell is in an optically polarized state and the other optically readable memory cell is in an optically unpolarized state, to nonvolatilely store a single binary bit of information.

In FIG. 4A, memory cell 200 is placed in a polarized state and memory cell 202 is placed in an unpolarized state, by operating polarizing/unpolarizing voltage sources 169A and 169B. The differential configuration of polarization/ unpolarization of cells 200 and 202 designates that a one bit is stored in bit storage unit 204. This differential configuration is used in FIG. 4A.

In FIG. 4A, the differential current detector 285 is connected to leads 245A and 245B. Lead 245A is connected to sensing diode region 230A of cell 200. Lead 245B is connected to sensing diode region 230B of cell 202. Detector 285 can determine which of memory cells 200 and 202 conducts more current, when the memory cells are respectively illuminated by polarized light 290A and 290B from polarizing light sources 292A and 292B, and switch 282 is closed. Voltage source 284 sends different amounts of electrons through differential current detector 285 and through memory cells 200 and 202, to ground. Substrate 238 is grounded. Differential current detector 285 detects that memory cell 202 is conducting more electrons than memory cell 200. In FIG. 4A, memory cell 202 conducts more electrons than memory cell 200. The differential configuration of polarized state of cell 200 and unpolarized state of cell 202 of FIG. 4A can be designated as a one bit.

As shown in FIG. 4B, memory cell 200 is placed in a unpolarized state and memory cell 202 is placed in a polarized state. This differential configuration of unpolarization/polarization of cells 200 and 202 can be detected, to read out that a zero bit is stored nonvolatilely in bit storage unit 204. This differential configuration is shown in FIG. 4B.

The use of the disclosed differential configuration of bit storage unit 204, with two optically readable ferroelectric memory cells written to opposite polarization states, nonvolatilely stores a single binary bit of information. The following benefits result:

(1) Improved signal to noise ratio; and
(2) Rejection of common mode signals resulting from
    a. changes in polarized light intensity
    b. changes in light polarization angle
    c. changes in temperature, and
    d. changes in surface reflectivity.

While the present invention has been disclosed in connection with the preferred embodiment thereof, it should be understood that there may be other embodiments which fall within the spirit and scope of the invention as defined by the following claims.

What is claim is:

1. An optically readable ferroelectric memory cell, comprising:

(a) a first translucent conductive layer;
(b) a side of a translucent ferroelectric layer, that is electrically writable into either an optically unpolarized state or optically polarized state, in parallel contact with the first translucent conductive layer;
(c) a second translucent conductive layer in parallel contact with a second side of the translucent ferroelectric layer;
(d) a first translucent insulator layer in parallel contact with a second side of the second translucent conductive layer;
(e) a side of a planar polarizer in parallel contact with a second side of the first translucent insulator layer;
(f) a second translucent insulator layer in parallel contact with a second side of the planar polarizer; and
(g) a sensing diode region within a surface of a semiconductor substrate, the sensing diode region in parallel contact with a second side of the second translucent insulator layer.

2. An optically readable ferroelectric memory cell, comprising:

(a) a first translucent metal layer;
(b) a side of a translucent ferroelectric layer, that is electrically writable into either an optically unpolarized state or optically polarized state, in parallel contact with the first translucent metal layer;
(c) a second translucent metal layer in parallel contact with a second side of the translucent ferroelectric layer;
(d) a side of a first translucent silicon dioxide layer in parallel contact with a second side of the second translucent metal layer;

(e) a side of a wire grid polarizer in parallel contact with a second side of the first translucent silicon dioxide layer;

(f) a side of a second translucent silicon dioxide layer in parallel contact with a second side of the planar wire grid polarizer; and (g) an n-type sensing diode region within a surface of a p-type silicon substrate, the sensing diode region in parallel contact with a second side of the second translucent silicon dioxide layer.

3. The optically readable ferroelectric memory cell of claim 2 and further comprising a translucent silicon dioxide passivation layer covering exposed portions of each of the first translucent conductive layer, the translucent ferroelectric layer, the second translucent conductive layer, the first translucent insulator layer, the planar polarization, the second translucent insulator layer, and the sensing diode region.

4. The optically readable ferroelectric memory cell of claim 3 and further comprising:

(a) a first metal electrode in electrical contact with the first translucent conductive layer, the first metal electrode extending through the translucent silicon dioxide passivation layer;

(b) a second metal electrode in electrical contact with the second translucent conductive layer, the second metal electrode extending through the translucent silicon dioxide passivation layer; and (c) a third metal electrode in electrical contact with the sensing diode region the third metal electrode extending through the translucent silicon dioxide passivation layer.

5. A memory array, the memory array comprising a plurality of optically readable ferroelectric memory cells built into a semiconductor substrate, each optically readable ferroelectric memory cell, comprising:

(a) a first translucent conductive layer;

(b) a side of a translucent ferroelectric layer that is electrically writable into either an optically unpolarized state or optically polarized state, in parallel contact with the first translucent conductive layer;

(c) a second translucent conductive layer in parallel contact with a second side of the translucent ferroelectric layer;

(d) a first translucent insulator layer in parallel contact with a second side of the second translucent conductive layer;

(e) a side of a planar polarizer in parallel contact with a second side of the first translucent insulator layer;

(f) a second translucent insulator layer in parallel contact with a second side of the planar polarizer; and (g) a sensing diode region built within a surface of the semiconductor substrate, the sensing diode region in parallel contact with a second side of the second translucent insulator layer.

6. A bit storage unit comprising two optically readable ferroelectric memory cells of claim 1, the optically readable ferroelectric memory cells being operable in a differential configuration.

7. An optically readable ferroelectric memory cell, comprising:

(a) a sensing diode region within a surface of a semiconductor substrate;

(b) a translucent silicon dioxide layer on the sensing diode region;

(c) a planar wire grid polarizer on the translucent silicon dioxide layer;

(d) a second translucent silicon dioxide layer on the planar wire grid polarizer;

(e) a translucent metal layer on the second translucent silicon dioxide layer;

(f) a translucent ferroelectric layer that is electrically writable into either an optically unpolarized state or optically polarized state, on the translucent metal layer; and (g) a second translucent metal layer on the translucent ferroelectric layer.

8. The optically readable ferroelectric memory cell of claim 7 and further comprising a translucent silicon dioxide passivation layer covering exposed portions of the sensing diode region, the translucent silicon dioxide layer, the planar wire grid polarizer, the second translucent silicon dioxide layer, the translucent metal layer, the translucent ferroelectric layer and the second translucent metal layer.

9. The optically readable ferroelectric memory cell of claim 8 and further comprising:

(a) a first metal electrode in electrical contact with the second translucent metal layer, the first metal electrode extending through the translucent silicon dioxide passivation layer;

(b) a second metal electrode in electrical contact with the translucent metal layer, the second metal electrode extending through the translucent silicon dioxide passivation layer;

(c) a third metal electrode in electrical contact with the sensing diode region, the third metal electrode extending through the translucent silicon dioxide passivation layer.

* * * * *